United States Patent
Kim et al.

(10) Patent No.: US 8,404,405 B2
(45) Date of Patent: Mar. 26, 2013

(54) PELLICLE FRAME, PELLICLE, LITHOGRAPHY APPARATUS, AND METHOD OF FABRICATING THE PELLICLE FRAME

(75) Inventors: Jung-jin Kim, Hwaseong-si (KR);
Bum-hyun An, Hwaseong-si (KR);
Chan-uk Jeon, Seongnam-si (KR);
Jang-dong You, Hwaseong-si (KR);
Sung-wan Kim, Hwaseong-si (KR);
Ik-jun Kim, Hwaseong-si (KR);
Jae-hyuck Choi, Yongin-si (KR);
Han-shin Lee, Hwaseong-si (KR)

(73) Assignees: Samsung Electronics Co., Ltd., Suwon-si, Gyeonggi-do (KR); Fine Semitech Corp., Hwaseong-si, Gyeonggi-do (KR)

( * ) Notice: Subject to any disclaimer, the term of this patent is extended or adjusted under 35 U.S.C. 154(b) by 159 days.

(21) Appl. No.: 12/879,574

(22) Filed: Sep. 10, 2010

(65) Prior Publication Data

US 2011/0063601 A1   Mar. 17, 2011

(30) Foreign Application Priority Data

Sep. 14, 2009  (KR) .................. 10-2009-0086670

(51) Int. Cl.
*G03F 1/00* (2012.01)
*G03F 1/64* (2012.01)
*B32B 1/08* (2006.01)

(52) U.S. Cl. ............................. 430/5; 428/14; 428/34.1
(58) Field of Classification Search .................. 428/14, 428/34.1; 430/4–5
See application file for complete search history.

(56) References Cited

U.S. PATENT DOCUMENTS

| | | | |
|---|---|---|---|
| 3,703,094 A * | 11/1972 | Cree, Jr. ................... | 72/389.3 |
| 5,420,612 A * | 5/1995 | Brock et al. .............. | 347/201 |
| 6,707,883 B1 * | 3/2004 | Tiearney et al. .......... | 378/144 |
| 2006/0246234 A1 * | 11/2006 | Meyers et al. ............ | 428/14 |
| 2009/0317656 A1 * | 12/2009 | Dai et al. .................. | 428/610 |

FOREIGN PATENT DOCUMENTS

| | | |
|---|---|---|
| JP | 10280081 A  * | 10/1998 |
| JP | 2006-184822 A | 7/2006 |
| KR | 1994-0024981 | 11/1994 |
| KR | 10-2005-0070434 A | 7/2005 |
| KR | 10-2006-0065231 A | 6/2006 |

* cited by examiner

*Primary Examiner* — Mark F Huff
*Assistant Examiner* — John S Ruggles
(74) *Attorney, Agent, or Firm* — Lee & Morse, P.C.

(57) ABSTRACT

A pellicle frame, including aluminum, aluminum oxide, and a transition metal.

11 Claims, 7 Drawing Sheets

PELLICLE FRAME, PELLICLE, LITHOGRAPHY APPARATUS, AND METHOD OF FABRICATING THE PELLICLE FRAME

BACKGROUND

1. Field

Embodiments relate to a pellicle frame, a pellicle, a lithography apparatus, and method of fabricating the pellicle frame.

2. Description of the Related Art

The fabrication of semiconductor devices may involve a lithography process in which a pellicle may be used to prevent external contamination.

SUMMARY

It is a feature of an embodiment to provide a pellicle frame capable of suppressing the generation of extraneous matters and a method of fabricating the same.

It is another feature of an embodiment to provide a pellicle and a lithography apparatus including the pellicle frame.

At least one of the above and other features and advantages may be realized by providing a pellicle frame, including aluminum, aluminum oxide, and a transition metal.

The pellicle frame may include a first material layer and a second material layer disposed on the first material layer, the first material layer including the aluminum, and the second material layer including the aluminum oxide and the transition metal.

The second material layer may be in direct contact with the first material layer on the first material layer.

The second material layer may be directly exposed to a periphery of the pellicle frame.

The second material layer may be a ceramic layer including the aluminum oxide and the transition metal.

The second material layer may include a material having an emissivity of about 0.8 to about 0.99, a hardness of about 500 to about 1000 HV, and a pore density of about 2 to about 15%.

The first material layer may include at least one of: an aluminum alloy containing the aluminum and zinc; an aluminum alloy containing the aluminum, magnesium, and silicon; and an aluminum alloy containing the aluminum and magnesium.

At least one of the above and other features and advantages may be realized by providing a pellicle including a pellicle frame according to an embodiment.

At least one of the above and other features and advantages may be realized by providing a lithography apparatus, including a reticle, a pellicle frame attached to the reticle and disposed on the reticle, the pellicle frame including a first material layer and a second material layer disposed on the first material layer, the first material layer including aluminum, and the second material layer including aluminum oxide and a transition metal, and a pellicle membrane attached to the pellicle frame and disposed on the pellicle frame.

The second material layer may be directly exposed in a space defined by the reticle, the pellicle membrane, and the pellicle frame.

The second material layer may be a ceramic material layer including the aluminum oxide and the transition metal.

The second material layer may include a material having an emissivity of about 0.8 to about 0.99, a hardness of about 500 to about 1000 HV, and a pore density of about 2 to about 15%.

At least one of the above and other features and advantages may be realized by providing a method of fabricating a pellicle frame, the method including preparing a main body that includes a first material layer including aluminum, and forming a second material layer on a surface of the first material layer using a wet process using wet oxidation plasma, the second material layer including aluminum oxide and a transition metal.

Forming the second material layer may include dipping the main body in an alkali electrolytic solution containing ions of the transition metal, and generating the wet oxidation plasma in a periphery of the main body to form the second material layer including the aluminum oxide and the transition metal on the surface of the first material layer.

Generating the wet oxidation plasma may include applying a positive current pulse to the main body, and applying a negative current pulse to the alkali electrolytic solution.

The method may further include, after forming the second material layer, dipping the main body in deionized water.

The deionized water may be maintained at a temperature of about 70° C. or higher.

The second material layer may be formed to a thickness of about 5 to about 30 µm.

At least one of the above and other features and advantages may be realized by providing a method of fabricating a pellicle frame, the method including preparing a main body that includes a first material layer including aluminum, and forming a second material layer on a surface of the main body using a dry process using dry oxidation plasma, the second material layer including aluminum oxide and a transition metal.

Forming the second material layer may include mounting a target containing an element of the transition metal in a vacuum evaporation apparatus, and generating the dry oxidation plasma on the surface of the main body to form the second material layer including the aluminum oxide and the transition metal on the surface of first material layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2009-0086670, filed on Sep. 14, 2009, in the Korean Intellectual Property Office, and entitled: "Pellicle Frame, Pellicle, Lithography Apparatus, and Method of Fabricating the Pellicle Frame," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

It will be understood that, although the terms first, second, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the inventive concept.

Spatially relative terms, such as "on", "above", "lower", "below" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Herein, the term "layer" may refer to a portion of a structure formed by overlapping objects. Thus, the term "layer" may not be construed as being limited to a thin layer.

Figure 1:
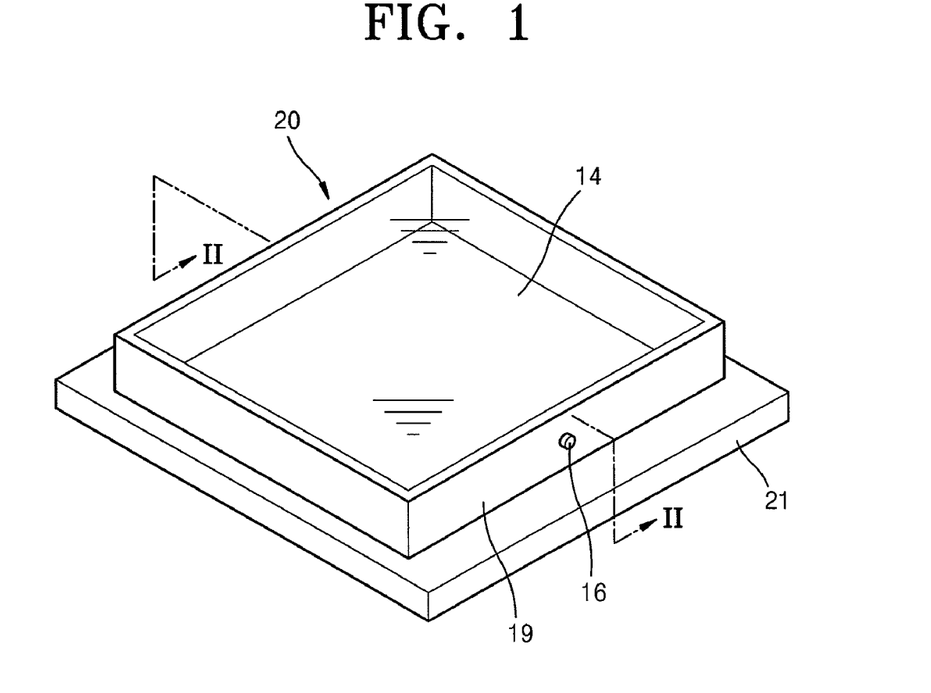
FIG. 1 illustrates a perspective view of a lithography apparatus including a pellicle, according to an embodiment.
Figure 2:
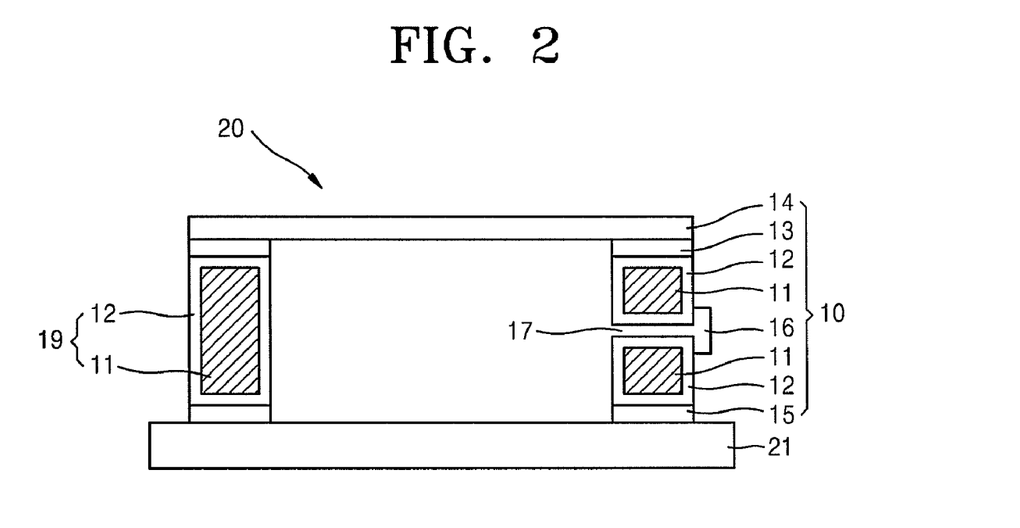
FIG. 2 illustrates a cross-sectional view taken along line II-II of the pellicle of FIG. 1.

FIG. 1 illustrates a perspective view of a lithography apparatus 20 including a pellicle, according to an embodiment, and FIG. 2 illustrates a cross-sectional view taken along line II-II of FIG. 1 showing details of pellicle 10.

Referring to FIGS. 1 and 2, the lithography apparatus 20 may include the pellicle 10 attached to a reticle 21 and disposed on the reticle 21.

The reticle 21 may have a first lateral surface on which a circuit pattern to be transferred to a wafer is formed. To prevent external contamination of the circuit pattern, the pellicle 10 may be attached to the first lateral surface of the reticle 21 on which the circuit pattern is formed.

The pellicle 10 may include a pellicle frame 19 and a pellicle membrane 14. The pellicle frame 19 may include a first material layer 11, which may form as a main body, and a second material layer 12, which is disposed on a surface of the main body.

The pellicle frame 19 may have the form of a rectangular box with an open top and bottom surfaces. The pellicle frame 19 may be attached to the reticle 21, e.g., using a first adhesive layer 15. The pellicle frame 19 may also function as a support, such that the pellicle membrane 14 is spaced apart from the reticle 21 to be above the reticle 21.

The first material layer 11 may constitute the main body of the pellicle frame 19. The first material layer 11 may be formed of aluminum, e.g., an aluminum alloy.

The first material layer 11 may be formed of an aluminum alloy (e.g., a JIS A7000-series aluminum alloy) containing aluminum and zinc. For example, the first material layer 11 may be formed of A7075 aluminum alloy with a high hardness.

As another example, the first material layer 11 may be formed of an aluminum alloy (e.g., a JIS A6000-series aluminum alloy) containing aluminum, magnesium (Mg), and silicon (Si). For example, the first material layer 11 may be formed of A6061 aluminum alloy.

As another example, the first material layer 11 may be formed of an aluminum alloy (e.g., a JIS A5000-series aluminum alloy) containing aluminum and magnesium (Mg). For example, the first material layer 11 may be formed of A5052 aluminum alloy.

To prevent light used for a lithography process from being scattered on the pellicle frame 19, the pellicle frame 19 may be a blackish color. Also, when the pellicle frame 19 is a blackish color, it may be easy to detect failures of the pellicle frame 19 during a delivery inspection of pellicles.

Aluminum used for the first material layer 11 may not have a blackish color. Thus, a second material layer 12 having a blackish color may be formed on the surface of the main body (i.e., on first material layer 11) of the pellicle frame 19 formed of an aluminum alloy. The second material layer 12 may be formed to cover the entire surface of the first material layer 11. In an implementation, the second material layer may be formed to cover the entire inward surface of the first material layer, i.e., the surface facing the circuit pattern on the reticle 21.

The second material layer 12 may be directly on the surface of the first material layer 11, without interposing another layer between the second and first material layers 12 and 11.

The second material layer 12 may be formed of, e.g., aluminum oxide ($Al_2O_3$) and a transition metal. In an implementation, the second material layer 12 may be thicker than a native oxidation layer on the surface of the first material layer 11. Aluminum is easily oxidized in a natural state. However, a layer containing aluminum oxide may be further formed on the surface of the aluminum to protect the surface of the aluminum.

The transition metal may refer to an element of groups IIB through IB of the Periodic Table. For example, the transition metal may refer to an element of the Periodic Table in which an electron having the highest energy at a ground state is at a d-orbit. By appropriately applying the transition metal to aluminum oxide, a new energy level may be formed in a bandgap of the aluminum oxide to form a thermodynamically stable second material layer 12 that takes on a desired blackish color. In an implementation, the second material layer 12 may be a ceramic layer including aluminum oxide and a transition metal.

As described above, the second material layer 12 may be formed of aluminum ($Al_2O_3$) and a transition metal. Thus, it may be unnecessary to insert an additional organic coloring agent into the main body of the pellicle frame 19 formed of an aluminum alloy. The organic coloring agent may be excited by light (e.g., light irradiated by a deep ultraviolet (DUV) light source) used for a lithography process, fall out of the pellicle frame 19, and act as defects. Thus, when the second material layer 12 formed of aluminum oxide and a transition metal is formed on the first material layer 11 of the pellicle frame 19 formed of aluminum, outgassing caused by the organic coloring agent may be avoided.

Also, when the organic coloring agent is inserted into the main body of the pellicle frame 19, a polymer coating layer, such as an inner sticky adhesive (ISA), may be finally formed on the surface of the main body of the pellicle frame 19 to seal the organic coloring agent to avoid exposing the organic coloring agent to outside. The polymer coating layer may be excited by light (e.g., light irradiated by a DUV light source), decompose, and act as defects.

In contrast, when the second material layer 12 is formed of aluminum oxide ($Al_2O_3$) and a transition metal according to an embodiment, the additional organic coloring agent and the polymer coating layer may not be required, so that generation of defects caused by a polymer coating layer, such as ISA, may be avoided.

As a result, when the second material layer 12 formed of aluminum oxide and a transition metal is formed on the surface of the main body of the pellicle frame 19, it may be unnecessary to form an additional layer on the second material layer 12 so that the second material layer 12 may be directly exposed to the periphery of the pellicle frame 19. In an implementation, the second material layer 12 formed on the main body of the pellicle frame 19 may be in direct contact with the ambient atmosphere. As described above, the second material may take on a blackish color. Thus, neither an organic coloring agent nor an additional polymer coating layer, such as ISA, which may be formed on the second material layer 12, may be required.

For the same reason, when the second material layer 12 including aluminum oxide and a transition metal according to an embodiment is formed on the surface of the main body of the pellicle frame 19, the second material layer 12 may be directly exposed to a space defined by the reticle 21, the pellicle membrane 14, and the pellicle frame 19, and it may be unnecessary to form an additional polymer coating layer, such as ISA, on the second material layer 12.

The second material layer 12 including aluminum oxide $Al_2O_3$ and a transition metal according to an embodiment may be formed as a lusterless material being a blackish color and having an emissivity of about 0.8 to about 0.99. The emissivity may refer to a ratio of a radiant emission of the subject material to a radiant emission of a black body maintained at the same temperature as the subject material. In general, aluminum having a purity of 98.3% may have an emissivity of about 0.05, and aluminum oxidized at a temperature of about 600° C. may have an emissivity of about 0.19.

When the second material layer 12 has an emissivity lower than 0.8, light used for a lithography process may be scattered on the second material layer 12, and a process of detecting defects of the pellicle frame 19 may be precluded.

The second material layer 12 according to an embodiment may be formed of a material having a hardness of about 500 to about 1000 HV (HV refers to Vickers hardness), and having a pore density of about 2 to about 15%.

Referring to FIGS. 1 and 2 again, in an implementation the pellicle membrane 14 may be attached to the pellicle frame 19 with a second adhesive layer 13. To prevent inflation of the pellicle membrane 14 during the mounting of the pellicle 10 on the reticle 21, a vent hole 17 may be formed in the lateral surface of the pellicle frame 19. An air filter 16 may be installed to prevent inflow of extraneous matters through the vent hole 17.

Although FIGS. 1 and 2 illustrate that one vent hole 17 and one air filter 16 are installed in the lateral surface of the pellicle frame 19, the positions and numbers of the vent holes 17 and the air filters 16 are not limited thereto. For example, a plurality of vent holes 17 and a plurality of air filters 16 may be disposed along the lateral surface of the pellicle frame 19.

Referring to FIG. 2, the second material layer 12 may also be formed in the vent hole 17, such that the second material layer 12 may be formed on the sidewall of the vent hole 17. When the second material layer 12 of FIG. 2 is subsequently formed on the first material layer 11 of the pellicle frame 19, in which the vent hole 17 is already formed, the thickness of the second material layer 12 of FIG. 2 is preferably precisely controlled to avoid completely filling the vent hole 17.

Figure 3:
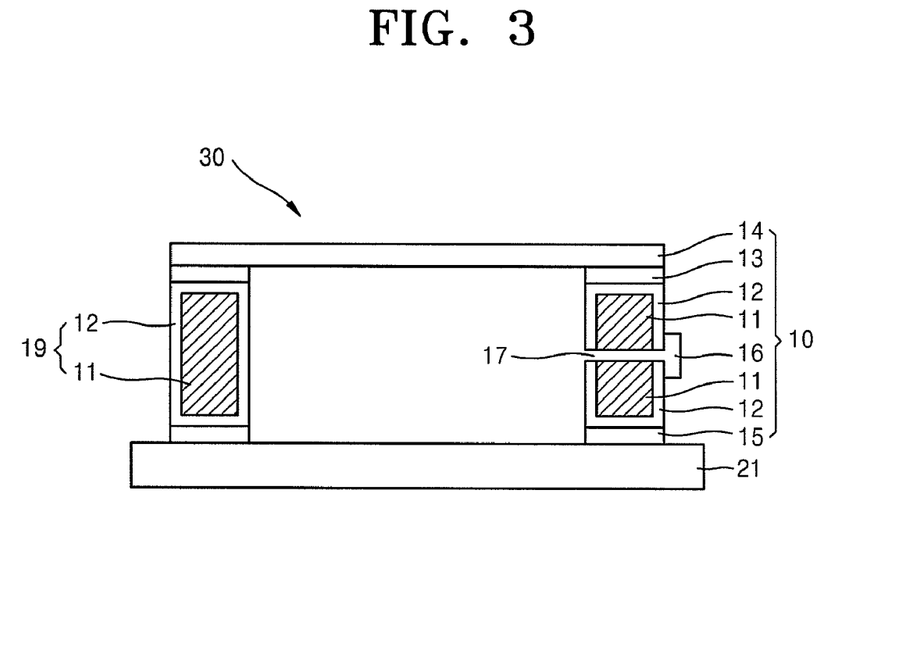
FIG. 3 illustrates a cross-sectional view of a pellicle, according to another embodiment.

FIG. 3 illustrates a cross-sectional view of a lithography apparatus 30 including the pellicle 10, according to another embodiment.

The lithography apparatus 30 of FIG. 3 may be substantially the same as the lithography apparatus 20 of FIG. 2, except that the second material layer 12 is not formed in the vent hole 17. Thus, a description of elements that are the same as those of the lithography apparatus 20 in FIG. 2 will be omitted here.

Referring to FIG. 3, the second material layer 12 may not be formed in the vent hole 17, such that the second material layer 12 may not be formed on the sidewall of the vent hole 12. Thus, the second material layer 12 of FIG. 3 may be formed on the first material layer 11, i.e. the main body of the pellicle frame 19 in which the vent hole 17 is already formed, after the vent hole 17 is sealed. Alternatively, after the second material layer 12 is formed on the first material layer 11 of the pellicle frame 19 in which the vent hole 17 is not formed yet, the vent hole 17 may be formed. In the lithography apparatus 30 of the present embodiment, the thickness of the second material layer 12 may be controlled more easily than in the lithography apparatus 20 of FIG. 2.

Figure 4:
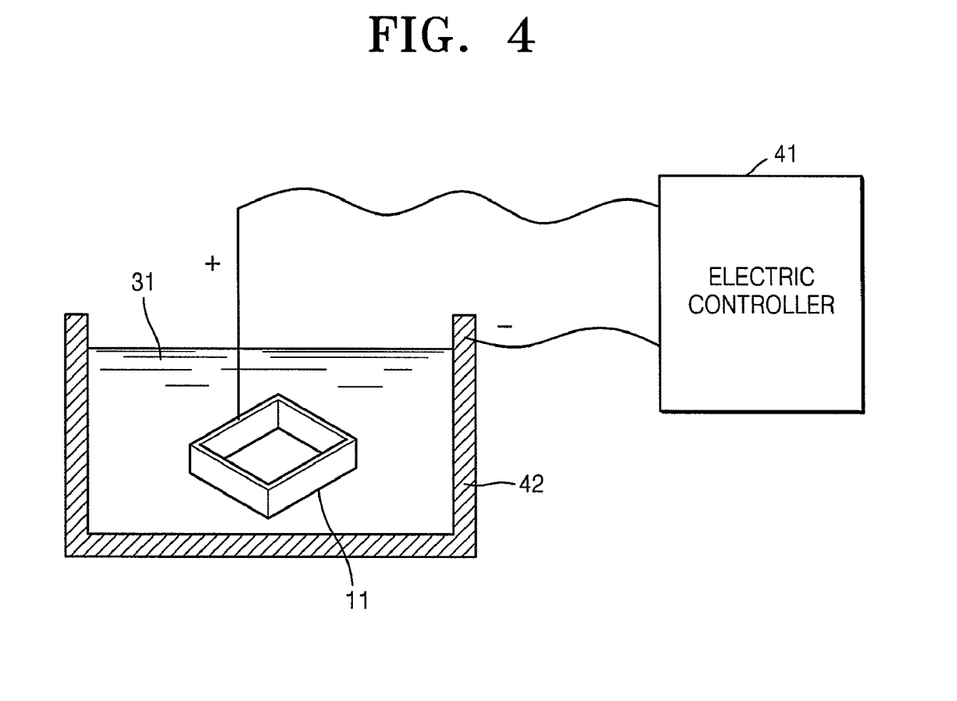
FIG. 4 illustrates a schematic diagram illustrating a method of fabricating a pellicle, according to an embodiment.

FIG. 4 is a schematic diagram illustrating a method of fabricating a pellicle, according to an embodiment.

Referring to FIG. 4, a main body, i.e. a first material layer 11, of a pellicle frame 19 formed of aluminum may be prepared.

For example, the first material layer 11 of the pellicle frame 19 may be formed of an aluminum alloy (i.e., a JIS A7000 aluminum alloy) formed of aluminum and zinc, for example, A7075 aluminum alloy with a high hardness.

As another example, the main body 11 of the pellicle frame 19 may be formed of an aluminum alloy (i.e., a JIS A6000 aluminum alloy) formed of aluminum, magnesium, and silicon, for example, A6061 aluminum alloy with high machinability.

As another example, the main body 11 of the pellicle frame 19 may be formed of an aluminum alloy (i.e., a JIS A5000 aluminum alloy) formed of aluminum and magnesium, for example, A5052 aluminum alloy.

Subsequently, an electric controller 41 configured to supply a positive current to the main body 11 of the pellicle frame 19 and supply a negative current to a bath 42 may be provided.

Thereafter, the main body 11 of the pellicle frame 19 may be dipped in the bath 42 containing an electrolytic solution 31. The electrolytic solution 31 may contain a transition metal element. The electrolytic solution 31 may be maintained at a temperature of about 25° C.

The electrolytic solution 31 may be an alkali electrolytic solution. For example, the electrolytic solution 31 may be an alkali electrolytic solution having a pH value of about 8 to about 10. In the method of fabricating the pellicle frame according to the present embodiment, an acidic electrolytic solution, such as a sulfuric acid, a nitric acid, or an organic acid, may not be used. Thus, a haze phenomenon caused by $SO_x$ and/or $NO_x$ ions may be prevented.

Subsequently, wet oxidation plasma may be generated in the periphery of the main body 11 of the pellicle frame, thereby forming a second material layer 12 formed of aluminum oxide and the transition metal on the surface of the main body 11 of the pellicle frame 19.

Figure 11:
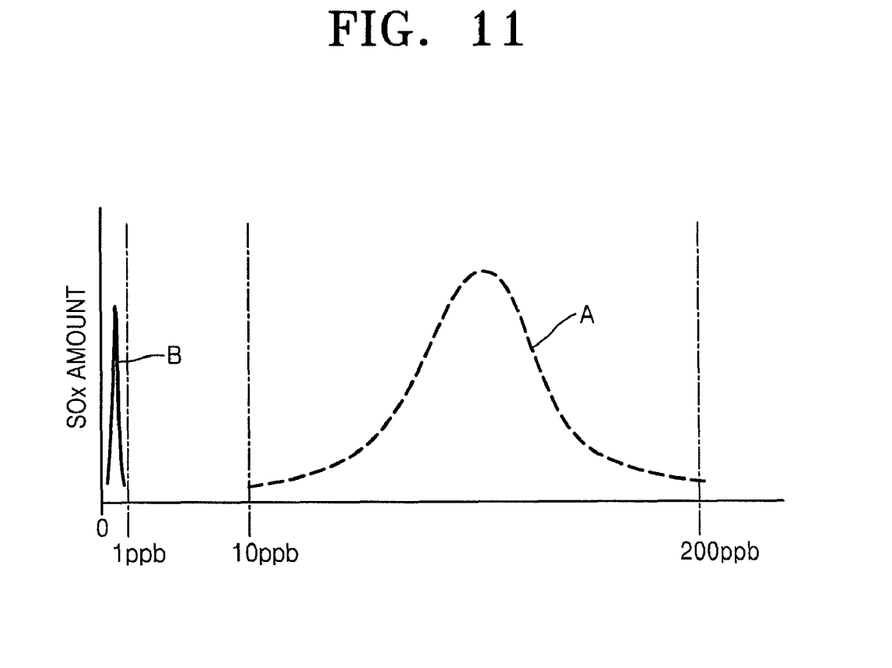
FIG. 11 illustrates a graph showing a comparison of the amounts of $SO_x$ outgassed from each pellicle formed using wet oxidation plasma according to an embodiment as compared to a conventional pellicle.

FIG. 11 illustrates a graph showing a comparison of the amounts of $SO_x$ outgassed from a pellicle formed using wet oxidation plasma according to an embodiment as compared to a conventional pellicle.

Referring to FIG. 11, $SO_x$ of several tens to several hundreds of ppb was outgassed from the conventional pellicle A. In comparison, $SO_x$ of 1 ppb or less was outgassed from the pellicle B formed using a wet oxidation plasma process according to the embodiment. Without being bound by theory, it may be concluded that this effect may be obtained because the present embodiment adopts an alkali electrolytic solution without an acidic electrolytic solution, such as a sulfuric acid, a nitric acid, or an organic acid.

Figure 5:
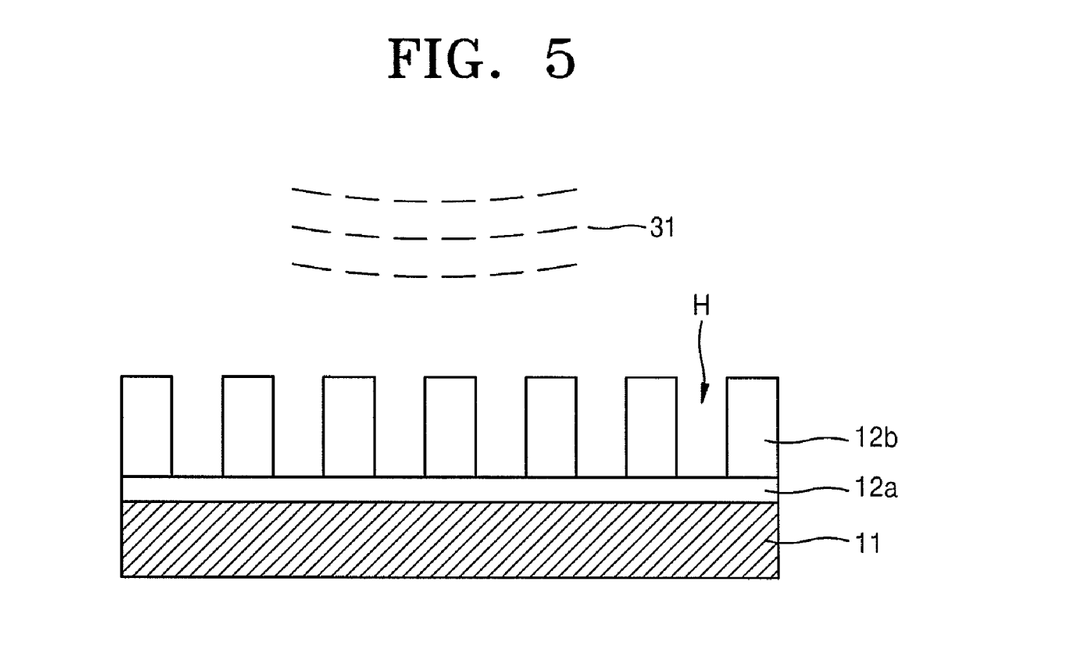
FIGS. 5 and 6 illustrate cross-sectional views of stages in a process of forming a material layer using wet oxidation plasma, according to an embodiment.
Figure 6:
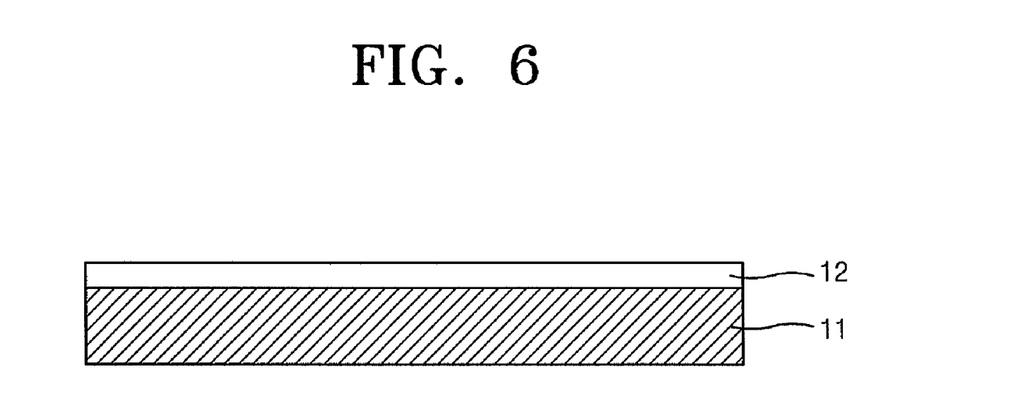

FIGS. 5 and 6 illustrate cross-sectional views of stages in a process of forming the second material layer using wet oxidation plasma, according to an embodiment.

Referring to FIG. 5, the main body 11 of a pellicle frame formed of aluminum may be dipped in an alkali electrolytic solution 31, and an anode oxidation process may be performed to form a porous layer 12b.

More specifically, when an oxidation process is performed using the main body 11 of the pellicle frame dipped in the alkali electrolytic solution 31 as an anode, a thin layer 12a formed of aluminum oxide ($Al_2O_3$) may be firstly formed on the main body 11 of the pellicle frame formed of aluminum. The thin layer 12a formed of aluminum oxide may serve as a barrier layer (hereinafter the thin layer 12a will be referred to as a 'barrier layer 12a').

In this case, when a sufficiently high voltage is applied to the main body 11 of the pellicle frame, the barrier layer 12a may be eroded by the alkali electrolytic solution 31 and break, thus generating heat. The heat may activate the erosion of the barrier layer 12a due to the alkali electrolytic solution 31, thereby forming the porous layer 12b.

In this case, oxygen may be generated to oxidize aluminum contained in the barrier layer 12a, thereby forming a new barrier layer 12a. This process may be repeated so that the porous layer 12b may be grown on the main body 11 of the pellicle frame formed of aluminum.

Thereafter, a positive current pulse may be applied to the main body 11 of the pellicle frame, and a negative current pulse may be applied to the bath 42 containing the alkali electrolytic solution 31, so that wet oxidation plasma may be generated in a space H between the porous layers 12b. In this case, the generated plasma may react with the alkali electrolytic solution 31 containing a transition metal and aluminum so that the second material layer 12 formed of aluminum oxide and the transition metal may be formed on the main body 11 of the pellicle frame, as shown in FIG. 6.

A subsequent cleaning process may be performed to remove impurities remaining on the surface of the second material layer 12 from the alkali electrolytic solution 31.

For example, after the second material layer 12 is formed on the main body 11 of the pellicle frame, the subsequent cleaning process may be performed. During the cleaning process, the pellicle frame 19 may be dipped in high-temperature deionized water (DIW) so that impurities originating from the alkali electrolytic solution 31 may be removed from the surface of the second material layer 12. Here, high-temperature DIW may refer to deionized water maintained at a temperature of about 70° C. or higher.

When a pellicle frame is colored using an organic coloring agent and a coating layer is formed on the pellicle frame by using an acidic electrolytic solution, such as a sulfuric acid, a nitric acid, or an organic acid, the organic coloring agent may be released into high-temperature DIW so that the pellicle frame may be discolored. Thus, in this case, the pellicle frame may be dipped in DIW maintained at room temperature for seven days through a cleaning process. Thus, the subsequent cleaning process may lead to a bottleneck phenomenon in the fabrication of pellicles.

In contrast, according to embodiments, a second material layer may be formed on a main body of a pellicle frame by using a wet oxidation plasma process using an alkali electrolytic solution without an organic coloring solution. In this case, even if the pellicle frame is dipped in high-temperature DIW for a long amount of time to remove impurities caused by an alkali electrolytic solution from the surface of the second material layer, the pellicle frame may not be discolored.

Figure 12:
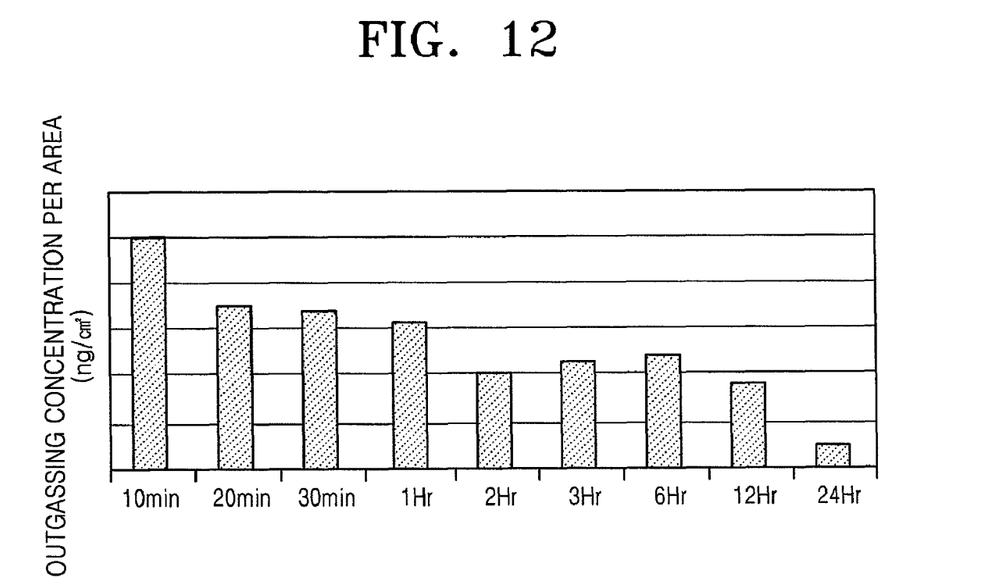
FIG. 12 illustrates a graph showing the effects of a cleaning process using high-temperature deionized water (DIW) with respect to a second material layer formed according to embodiment.

FIG. 12 illustrates a graph showing the effects of a cleaning process using high-temperature DIW with respect to a second material layer formed according to embodiment.

As described above, the second material layer formed using a wet oxidation plasma process according to the previous embodiment may be cleaned using high-temperature DIW. Referring to FIG. 12, it can be seen that impurities, which are caused by the alkali electrolytic solution 31 and remain on the pellicle frame 19, were reduced after the pellicle frame 19 was dipped in high-temperature DIW for 10 minutes, and 80% or higher of the impurities were reduced within 24 hours. Thus, a bottleneck phenomenon caused by the subsequent cleaning process in the fabrication of pellicle frames may be reduced or eliminated.

Figure 7:
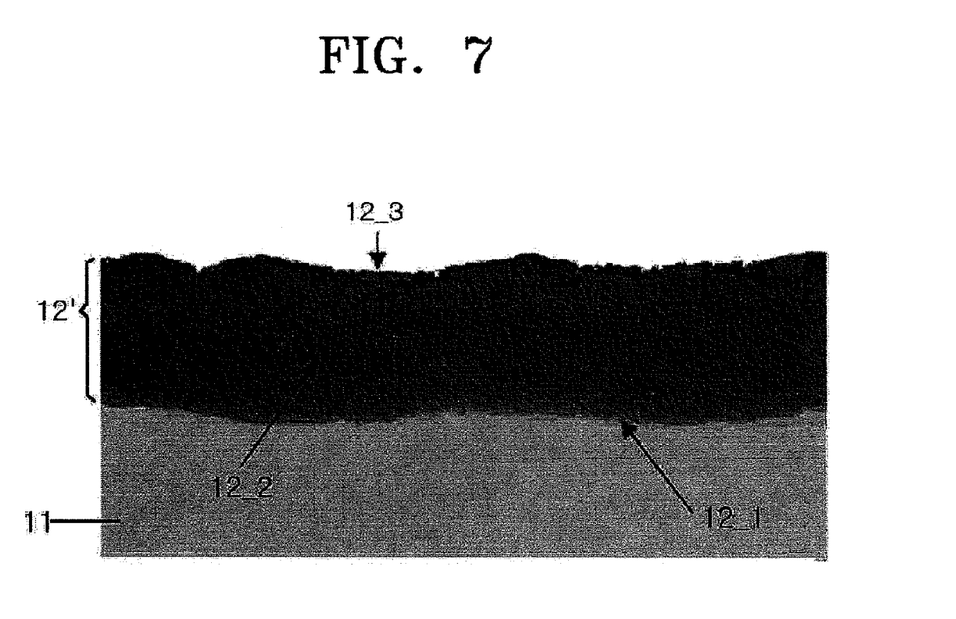
FIG. 7 illustrates a scanning electron microscope (SEM) image of a section of a second material layer formed using a method of fabricating a pellicle, according to an embodiment.
Figure 8:
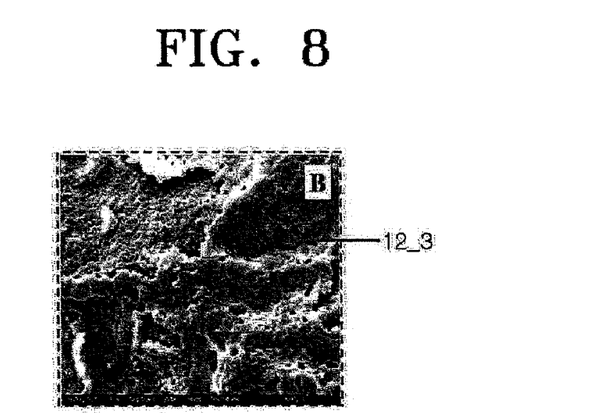
FIG. 8 illustrates a SEM image of a top surface of the second material layer of FIG. 7.

FIG. 7 illustrates a scanning electron microscope (SEM) image of a section of a second material layer 12' formed using a method of fabricating a pellicle, according to an embodiment, and FIG. 8 illustrates a SEM image of a top surface of the second material layer 12' of FIG. 7. The photograph of FIG. 7 may correspond to the drawing of FIG. 6.

Referring to FIG. 7, the second material layer 12' formed of aluminum oxide and a transition metal may be formed on a main body 11 of a pellicle frame formed of aluminum. The second material layer 12' may include a transitional layer 12_1, a functional layer 12_2, and a technological layer 12_3.

The functional layer 12_2 may be formed of a material having a hardness of about 500 to about 1000 HV and a pore density of about 2 to about 15%. The functional layer 12_2 may have a hard and dense structure. The transitional layer 12_1 may be formed to a thin thickness between the main body 11 of the pellicle frame formed of aluminum and the functional layer 12_2. The technological layer 12_3 may be formed on the functional layer 12_2. The technological layer 12_3 may be formed of a material having a hardness of about 500 HV or lower and a pore density of about 15% or higher so that the technological layer 12_3 may have a less dense and rougher surface than the functional layer 12_2. The second material layer 12' having the technological layer 12_3 may have a weaker and rougher top surface as shown in FIG. 8. Thus, extraneous matters may occur.

Figure 9:
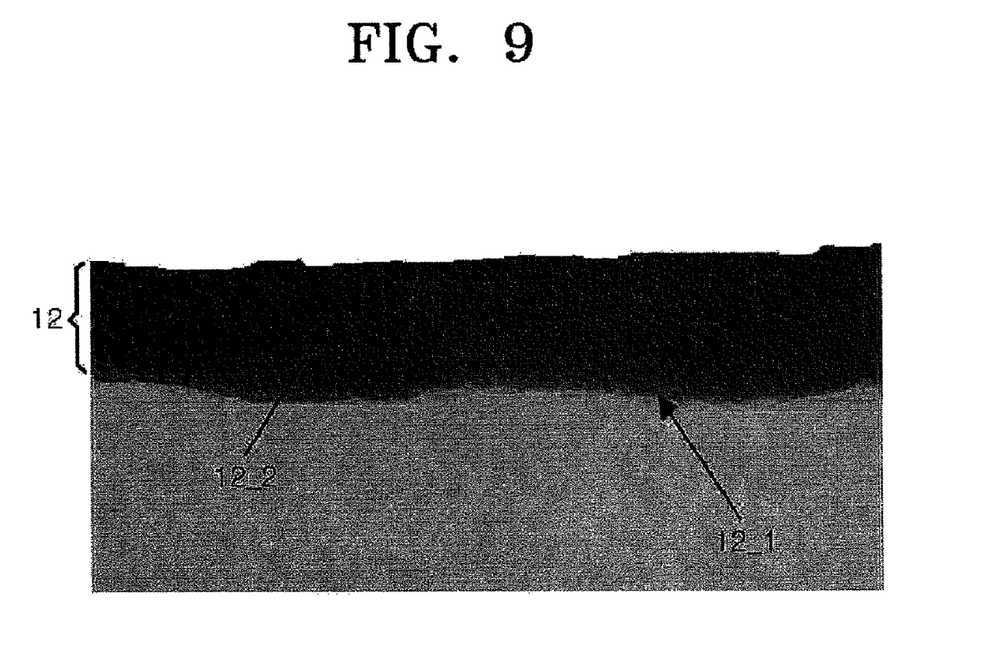
FIG. 9 illustrates a SEM image of a section of a second material layer formed using a method of fabricating a pellicle, according to another embodiment.
Figure 10:
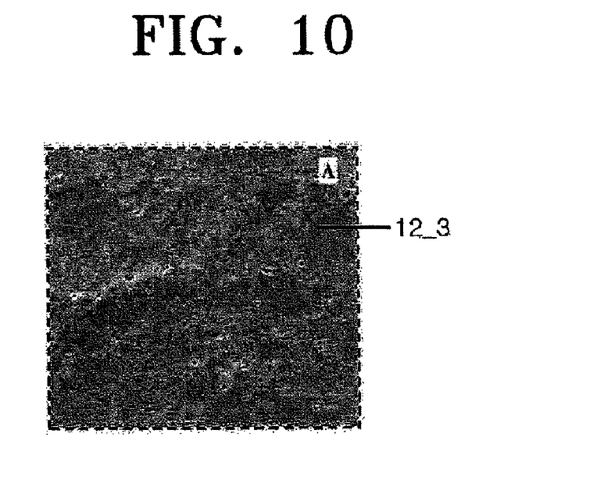
FIG. 10 illustrates a SEM photograph of a top surface of the second material layer of FIG. 9.

FIG. 9 illustrates a SEM image of a section of a second material layer 12 formed using a method of fabricating a pellicle, according to another embodiment, and FIG. 10 is a SEM image of a top surface of the second material layer 12 of FIG. 9. The photograph of FIG. 9 may correspond to the drawing of FIG. 6.

Referring to FIG. 9, the second material layer 12 may be formed of aluminum oxide and a transition metal may be formed on the main body 11 of the pellicle frame foamed of aluminum. The second material layer 12 may include a transitional layer 12_1 and a functional layer 12_2, and not the technological layer 12_3 of FIG. 7.

As shown in FIG. 10, the second material layer 12 without the technological layer 12_3 may have a hard and smooth top surface. Thus, extraneous particle matters may be lessened or eliminated to occur.

To form the second material layer 12 shown in FIGS. 9 and 10, the technological layer 12_3 of the second material layer 12' shown in FIGS. 7 and 8 may be removed using a chemical mechanical polishing (CMP) process. In another implementation, the formation of the technological layer 12_3 may be substantially suppressed during the formation of the second material layer 12 by using wet oxidation plasma. This may involve precisely controlling the composition and concentration of the electrolytic solution and the pulse width of electric energy and voltage required for generating plasma.

Figure 13:
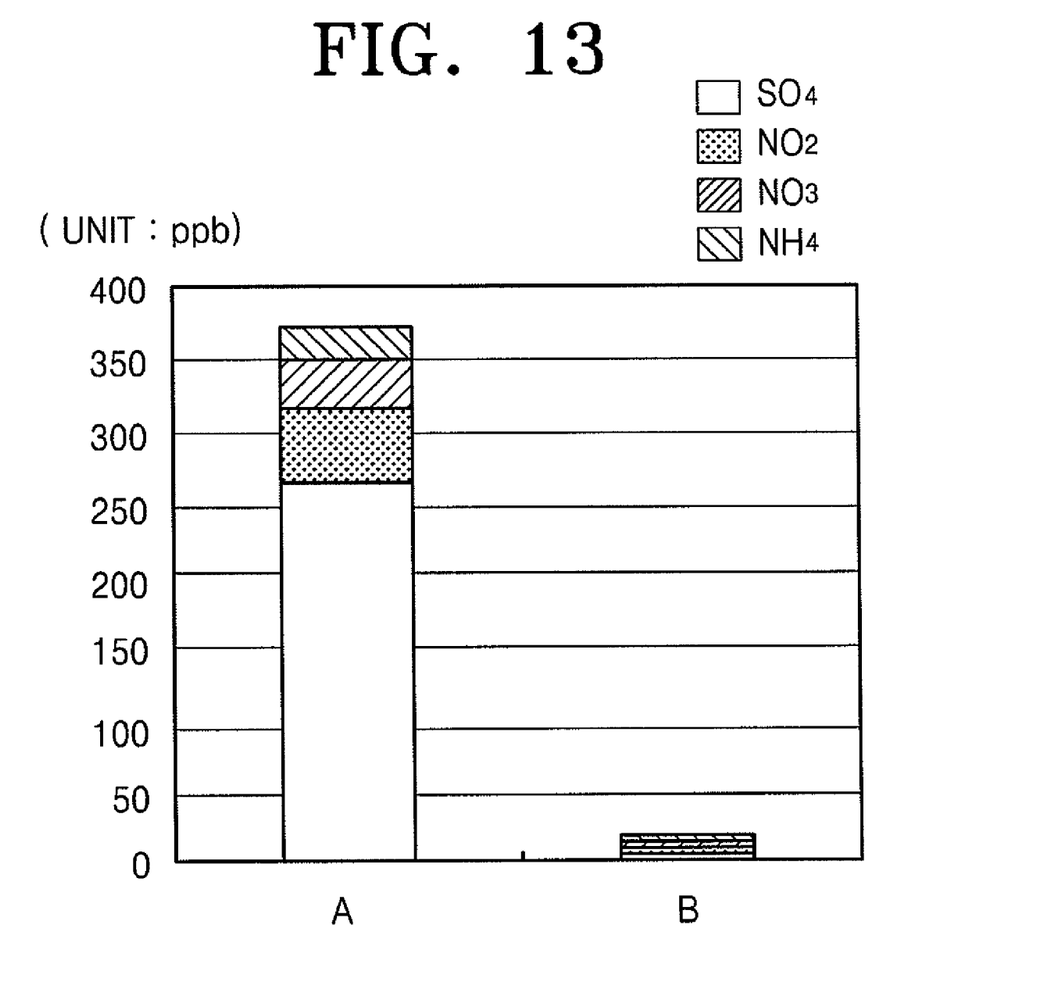
FIG. 13 illustrates a graph showing a comparison of the amounts of $SO_4$, $NO_2$, $NO_3$, and $NH_4$, which are outgassed from a pellicle formed using wet oxidation plasma according to an embodiment as compared to a conventional pellicle.

FIG. 13 illustrates a graph showing a comparison of the amounts of $SO_4$, $NO_2$, $NO_3$, and $NH_4$, which are outgassed from a pellicle formed using wet oxidation plasma according to an embodiment as compared to a conventional pellicle.

Referring to FIG. 13, $SO_4$, $NO_2$, $NO_3$, and $NH_4$, which might induce a haze phenomenon, were outgassed at several hundred ppb levels from a conventional pellicle A. Conversely, $SO_4$, $NO_2$, $NO_3$, and $NH_4$ were outgassed at several ppb levels from a pellicle B formed using a wet oxidation plasma process according to an embodiment. Thus, the pellicle B formed using the wet oxidation plasma process according to the embodiment may reduce ions. Therefore, the pellicle B formed using the wet oxidation plasma process according to an embodiment may reduce haze-causing ions as compared to the conventional pellicle A.

A method of forming the second material layer 12 on the main body 11 of the pellicle frame by using wet oxidation plasma was described above with reference to FIGS. 4 through 10. However, embodiments are not limited to the above-described method using wet oxidation plasma. For example, a second material layer formed of aluminum oxide and a transition metal using dry oxidation plasma may be formed on the main body 11 of the pellicle frame.

The formation of the second material layer by using the dry oxidation plasma may include mounting a target including the transition metal in a typical vacuum evaporation apparatus and generating dry oxidation plasma on the main body of the pellicle frame including aluminum to form the second material layer on the main body of the pellicle frame. In this case, the second material layer may include aluminum oxide and a transition metal.

Similarly, in this case, the second material layer including aluminum oxide and a transition metal may take on a blackish color so that neither an organic coloring agent nor the polymer coating layer may be required. Therefore, defects caused by the organic coloring agent and the polymer coating layer may be substantially removed.

Contamination of semiconductor devices by a pellicle frame may lead to a reduction in yield and an increase in the cost of lithography rework. As described above, embodiments may provide a pellicle frame, a pellicle, a lithography apparatus, and a method of fabricating a pellicle frame, which may suppress generation of extraneous matters and reduce the amount of outgassing. The pellicle frame may include a first material layer and a second material layer disposed on the first material layer. The first material layer may include aluminum, and the second material layer may include aluminum oxide and a transition metal. The pellicle or lithography apparatus may include the pellicle frame. The second material layer may be formed using wet oxidation plasma or dry oxidation plasma.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A pellicle frame for protecting a reticle, the pellicle frame comprising:
   a first material layer that includes aluminum, and
   a second material layer that includes aluminum oxide and a transition metal, the second material layer being disposed on the first material layer and being configured to isolate the reticle from the first material layer.

2. The pellicle frame as claimed in claim 1, wherein the second material layer is in direct contact with the first material layer.

3. The pellicle frame as claimed in claim 1, wherein the second material layer is directly exposed to a periphery of the pellicle frame, and the first material layer is completely enclosed by the second material layer.

4. The pellicle frame as claimed in claim 1, wherein the second material layer is a ceramic layer including the aluminum oxide and the transition metal.

5. The pellicle frame as claimed in claim 1, wherein the second material layer includes a material having an emissivity of about 0.8 to about 0.99, a hardness of about 500 to about 1000 HV, and a pore density of about 2 to about 15%.

6. The pellicle frame as claimed in claim 1, wherein the first material layer includes at least one of:
   an aluminum alloy containing the aluminum and zinc;
   an aluminum alloy containing the aluminum, magnesium, and silicon; and
   an aluminum alloy containing the aluminum and magnesium.

7. A pellicle comprising the pellicle frame as claimed in claim 1.

8. A lithography apparatus, comprising:
   a reticle;
   a pellicle frame attached to the reticle and disposed on the reticle, the pellicle frame including a first material layer and a second material layer disposed on the first material layer, the second material layer being configured to isolate the reticle from the first material layer, the first material layer including aluminum, and the second material layer including aluminum oxide and a transition metal; and a pellicle membrane attached to the pellicle frame and disposed on the pellicle frame.

9. The lithography apparatus as claimed in claim 8, wherein the second material layer is directly exposed in a space defined by the reticle, the pellicle membrane, and the pellicle frame, and the first material layer is completely enclosed by the second material layer.

10. The lithography apparatus as claimed in claim 8, wherein the second material layer is a ceramic material layer including the aluminum oxide and the transition metal.

11. The lithography apparatus as claimed in claim 8, wherein the second material layer includes a material having an emissivity of about 0.8 to about 0.99, a hardness of about 500 to about 1000 HV, and a pore density of about 2 to about 15%.

* * * * *